(12) United States Patent
Chen

(10) Patent No.: US 6,733,156 B2
(45) Date of Patent: May 11, 2004

(54) LIGHT-EMITTING DIODE ILLUMINATED LIGHT-EMITTING

(75) Inventor: Ping Chen, Shanghai (CN)

(73) Assignee: Kexin MA, Washington, DC (US)

( * ) Notice: Subject to any disclaimer, the term of this patent is extended or adjusted under 35 U.S.C. 154(b) by 71 days.

(21) Appl. No.: 09/987,770

(22) Filed: Nov. 15, 2001

(65) Prior Publication Data
US 2002/0057567 A1 May 16, 2002

(30) Foreign Application Priority Data
Nov. 16, 2000 (CN) .......................................... 00259194 A

(51) Int. Cl.[7] .............................................. F21V 13/04
(52) U.S. Cl. ......................... 362/245; 362/241; 362/247
(58) Field of Search ................................ 362/241, 245, 362/247, 800, 298, 301, 237, 243, 545; 257/98; 313/500

(56) References Cited

U.S. PATENT DOCUMENTS 5,241,457 A * 8/1993 Sasajima et al. ............ 362/241
5,924,785 A * 7/1999 Zhang et al. ............... 362/241
6,249,375 B1 * 6/2001 Silhengst et al. ........... 362/800

FOREIGN PATENT DOCUMENTS

WO WO 89/05524 * 6/1989

* cited by examiner

Primary Examiner—Sandra O'Shea
Assistant Examiner—Bao Q Truong

(57) ABSTRACT

The present invention relates to a light-emitting diode illuminated light-emitting module. It includes a plastic frame, an optical transparent board, a longitudinal electrode bar and an aluminum reflecting flat board. The optical transparent board is located at the top of the plastic frame. The longitudinal electrode bar is located below the optical transparent board and the aluminum reflecting flat board is located under the longitudinal electrode bar. On the surface of the longitudinal electrode bar, there are two copper pins. An LED chip, which is placed to emit light toward the aluminum reflecting flat board, is soldered on the printed electronic wire. Three types of the optical transparent board are used to control the outgoing light beam The LED lighting module is compact with excellent sealing structure. The present invention has enabled the production and installation of a formerly integral structure in various LED lighting modules much easier, flexible and involves only routine skill in the art.

6 Claims, 2 Drawing Sheets

LIGHT-EMITTING DIODE ILLUMINATED LIGHT-EMITTING

FIELD OF THE INVENTION

The present invention relates to a light-emitting diode (LED) incorporated light-emitting module suitable for illuminating (or LED light module). It is a mini-single lighting unit. Practically, it enables the production and installation of a formerly integral structure in various LED lighting modules to be much easier, flexible and involve only routine skill in the art.

BACKGROUND OF THE INVENTION

There are two methods to produce conventionally the LED illuminated module. One method is to solder the LED chip on a circuit board and the light emitted by the LED will be directed out from the front side. The main disadvantage of such type of the modules is that the light-emitting efficiency is too low. Another method is to pack several single LED lamps together according to a specific form, but the light emitting efficiency is still low. Moreover, the modules with an optical processing system are rather complicated and cost more during assembling and manufacturing.

SUMMARY OF THE INVENTION

Thus, the object of the present invention is to provide a mini-single lighting unit with the features of high light emitting efficiency and flexibility and simplicity in producing a formerly integral structure in various LED lighting modules.

According to the above object, a mini-single LED lighting module will be provided by the present invention. It comprises a plastic frame, an optical transparent board, a longitudinal electrode bar and an aluminum reflecting flat board. The optical transparent board is located at the top of the plastic frame. The longitudinal electrode bar is located below the optical transparent board and the aluminum reflecting flat board is located under the longitudinal electrode bar. On the surface of the longitudinal electrode bar, there are two copper pins as the electrodes. An LED chip, which is placed to emit light toward the aluminum reflecting flat board, is soldered on the printed electronic wire of the longitudinal electrode bar.

The LED lighting module is compact with excellent sealing structure, which makes the form and production of different integral structures in various LED lighting modules much easier and more flexible. Especially, the LED chip can be soldered directly on the printed electronic wire board by using the semiconductor surface mounting technique (SMD). And the heat dissipation will be more efficient and the luminosity can be increased by a large amount, therefore, the light emitting efficiency will be higher. Moreover, several LED chips with different colors can be surface mounted together simultaneously so that the excellent mixed color effect can be obtained.

BRIEF DESCRIPTION OF THE DRAWINGS

The preferred embodiments of the present invention will be described in detail below in conjunction with the accompanying drawings, wherein.

DETAILED DESCRIPTION OF THE PREFERRED EMBODIMENTS

Figure 1:
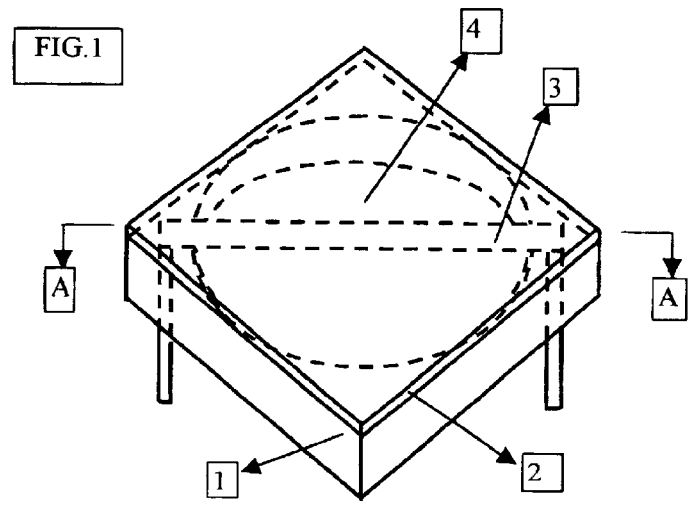
FIG. 1 is an elevation view of the LED lighting module of the present invention.

As shown in FIG. 1, the LED lighting module of the present invention comprises a plastic frame 1, an optical transparent board 2, a longitudinal electrode bar 3, and an aluminum reflecting flat board 4.

Figure 2:
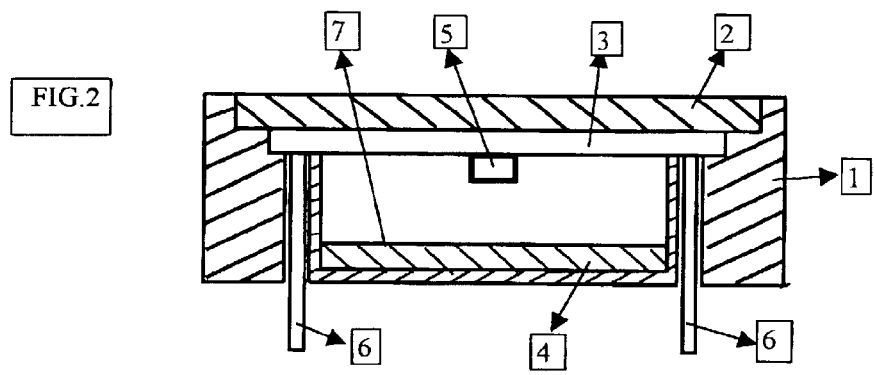
FIG. 2 is a cross-sectional view taken along line A—A in FIG. 1.

As shown is FIG. 2, the optical transparent board 2 is inserted at the top of the plastic frame 1. The longitudinal electrode bar 3 located below the optical board 2 and the aluminum reflecting flat board 4 is located under the longitudinal electrode bar 3. On the surface of the longitudinal electrode bar 3 there are two copper pins 6. An LED chip 5, which is placed to emit light toward the aluminum reflecting flat board 4, is soldered on the printed electronic wire 31.

As shown is FIG. 2, the aluminum reflecting flat board 4 has a plane board like structure. Actually, it is a piece of aluminum reflecting flat board with a mirror like polishing surface 7 and used widely in lighting industry. In general, the reflection efficiency is over 90%. In present invention, the aluminum reflecting flat board 4 is sealed inside the LED lighting module as shown in FIG. 2, so the mirror like polishing surface 7 of the aluminum reflecting flat board 4 can not be easily oxidized and will last longer even used outdoors.

Figure 3:
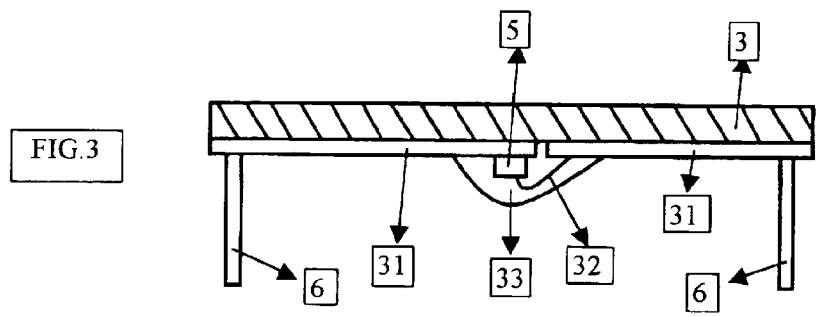
FIG. 3 is an enlarged embodiment of the longitudinal electrode bar in FIG. 1.

The longitudinal electrode bar 3 as shown in FIG. 3 is made of the printed electric wire board. Two copper pins 6 are soldered as electrodes on the printed electric wire 31. An LED chip 5 is electrically connected to the printed electric wire 31 by Au wires 32, and then, covered with epoxy resin 33 as a protection layer.

Figure 4:
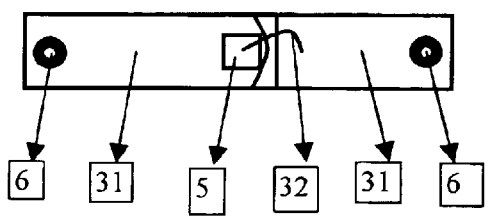
FIG. 4 is an overlooking view of LED chip with single wire on the longitudinal electrode bar.
Figure 5:
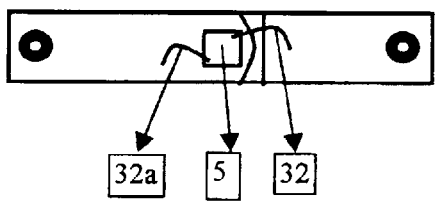
FIG. 5 is an overlooking view of LED chip with double wire on the longitudinal electrode bar.

As shown in FIG. 4, the overlooking view of the FIG. 3, single LED chip with one golden top pad is placed on the printed electric wire 31. In most situations, there are two golden top pads on InGaN LED chips. It needs one more Au wire 32a to make electrical connection, as shown in FIG. 5.

Figure 6:
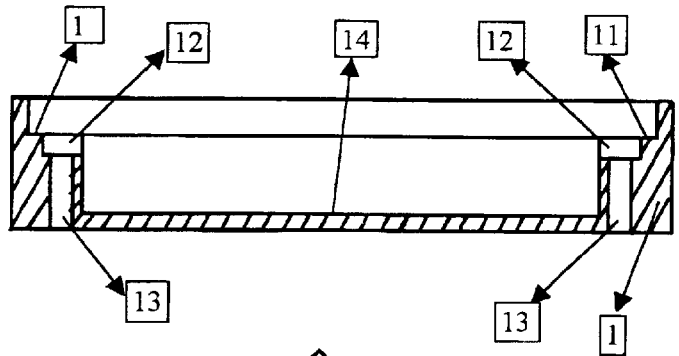
FIG. 6 is an enlarged embodiment of the plastic frame in FIG. 1.
Figure 7:
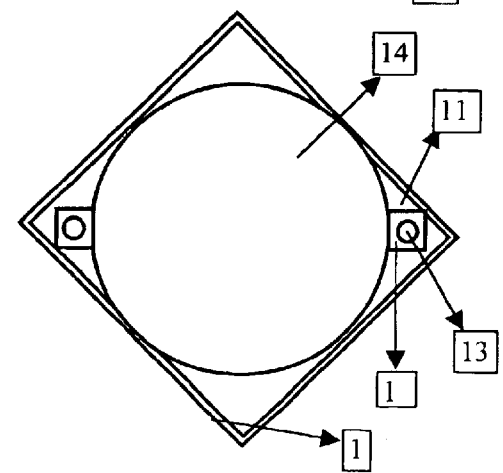
FIG. 7 is an overlooking view of the plastic frame to show the arrangement of the position labeled 13 and 12 in FIG. 6.

The enlarged embodiment of the plastic frame 1 is shown in FIG. 6. There is no any metal coating on the surface of the plastic frame 1. It is completely insulated. The position labeled 11 is used to hold the optical transparent board 2 by silicon resin. The position labeled 12 is used specially for placing the longitudinal electrode bar 3. It has the same shape and size as the longitudinal electrode bar 3, as show in FIG. 7. There are two outgoing holes 13 for copper pins 6 in the plastic frame 1. The aluminum reflecting flat board 4 is bonded by silicon resin on the bottom labeled 14 in FIG. 6 and 7 of the plastic frame 1. These features have been held that the installation of LED lighting modules involves only skill in the art.

Figure 8:
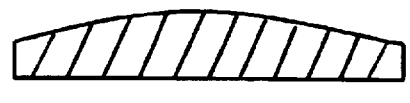
FIG. 8 is an embodiment of a convergence lens.
Figure 9:
FIG. 9 is an embodiment of a divergence lens.

In order to control the light beam, there are three types of the optical transparent board 2 used in present inventions as shown in FIGS. 1, 8 and 9.

As shown in FIG. 1, the optical transparent board 2 is in a type of flat lens. The flat lens doesn't influence the outgoing light beam reflected by the aluminum reflecting flat board 4 which get the light emitted by the LED chip 5. It provides a wider light reflection.

As shown in FIG. 8, the iptical transparent board 2 is in a type of convergence lens. The convergence lens concentrate the outgoing light beam reflected by the aluminum flat board 4 which get the light emitted by the LED chip 5. It provides a better focus beam.

As shown in FIG. 9, the iptical transparent board 2 is in a type of divergence lens. The divergence lens will change the outgoing light beam reflected by the aluminum reflecting flat board 4 which get the light emitted by the LED chip 5. It provides a better light distribution.

As mentioned above, two copper pins 6 in FIG. 3 are soldered on the printed electric wire 31. So the LED lighting moduling will be easily soldered through the two copper pins 6 onto the designed printed electric wire board. Therefore, to form an integral structure in various LED lighting modules become very easy and flexible and involve only routine skill in the art.

What is claimed is:

1. A light-emmitting diode illuminated light-emitting module, comprises a plastic frame, an optical transparent board inserted at the top of the plastic frame; a longitudinal electrode bar located below the optical transparent board; and an aluminum reflecting flat board located below the longitudinal electrode bar, wherein a single light-emitting diode chip, which is placed to emit light toward the aluminum reflecting flat board, is installed on the longitudinal electrode bar; and the aluminum reflecting flat board is placed at the bottom of the plastic frame near the LED chip.

2. The light-emitting diode illuminated light-emitting module according to claim 1, wherein, the aluminum reflecting flat board has a plane board structure.

3. The light-emitting diode illuminated light-emitting module according to claim 1, wherein, the optical transparent board is a convergence lens.

4. The light-emitting diode illuminated light-emitting module according to claim 1, wherein, the optical transparent board is a divergence lens.

5. The light-emitting diode illuminated light-emitting module according to claim 1, wherein, said longitudinal electrode bar comprises copper pins.

6. The light-emitting diode illuminated light-emitting module according to claim 1, further comprising outgoing holes for copper pins are placed on the plastic frame.

\* \* \* \* \*